(12) United States Patent
Shin et al.

(10) Patent No.: US 6,797,570 B2
(45) Date of Patent: Sep. 28, 2004

US006797570B2

(54) NAND-TYPE FLASH MEMORY DEVICES AND METHODS OF FABRICATING THE SAME

(75) Inventors: Kwang-Shik Shin, Seoul (KR); Kyu-Charn Park, Pyoungtaek-shi (KR); Heung-Kwun Oh, Kyunggi-do (KR); Sung-Hoi Hur, Seoul (KR)

(73) Assignee: Samsung Electronics Co., Ltd. (KR)

( * ) Notice: Subject to any disclaimer, the term of this patent is extended or adjusted under 35 U.S.C. 154(b) by 12 days.

(21) Appl. No.: 10/087,330

(22) Filed: Mar. 1, 2002

(65) Prior Publication Data

US 2002/0081806 A1 Jun. 27, 2002

Related U.S. Application Data

(62) Division of application No. 09/678,917, filed on Oct. 4, 2000, now Pat. No. 6,376,876.

(30) Foreign Application Priority Data

Jan. 17, 2000 (KR) .......................................... 2000-2039

(51) Int. Cl.$^7$ ............................................ H01L 21/336
(52) U.S. Cl. ...................... 438/279; 438/257; 438/258; 438/275; 438/587

(58) Field of Search .................................. 438/587, 257, 438/258, 241, 279, 275, 266

(56) References Cited

U.S. PATENT DOCUMENTS

| | | | | |
|---|---|---|---|---|
| 5,280,446 A | * | 1/1994 | Ma et al. ..................... | 257/314 |
| 5,838,615 A | * | 11/1998 | Kamiya et al. ............. | 257/315 |
| 6,066,528 A | * | 5/2000 | Fazan et al. ................ | 438/253 |
| 6,080,624 A | * | 6/2000 | Kamiya et al. ............. | 438/257 |
| 6,114,767 A | * | 9/2000 | Nagai et al. ................ | 257/758 |

\* cited by examiner

Primary Examiner—Michael Trinh
(74) Attorney, Agent, or Firm—Mills & Onello, LLP

(57) ABSTRACT

NAND-type flash memory devices and methods of fabricating the same are provided. The NAND-type flash memory device includes a plurality of isolation layers running parallel with each other, which are formed at predetermined regions of a semiconductor substrate. This device also includes a string selection line pattern, a plurality of word line patterns and a ground selection line pattern which cross over the isolation layers and active regions between the isolation layers. Source regions are formed in the active regions adjacent to the ground selection line patterns and opposite the string selection line pattern. The source regions and the isolation layers between the source regions are covered with a common source line running parallel with the ground selection line pattern.

12 Claims, 13 Drawing Sheets

NAND-TYPE FLASH MEMORY DEVICES AND METHODS OF FABRICATING THE SAME

RELATED APPLICATIONS

This application is a divisional of copending U.S. application Ser. No. 09/678,917, filed on Oct. 4, 2000 now U.S. Pat. No. 6,376,876, the contents of which are incorporated herein in their entirety by reference.

This application relies for priority upon Korean Patent Application No. 2000-2039, filed on Jan. 17, 2000, the contents of which are herein incorporated by reference in their entirety.

FIELD OF THE INVENTION

This invention relates to semiconductor device and methods of fabricating the same and, more particularly, to NAND-type flash memory devices and methods of fabricating the same.

BACKGROUND OF THE INVENTION

Non-volatile memory devices such as flash memory devices do not lose data stored in their memory cells when the electric power supplied to the device is interrupted. Thus, the flash memory device is widely used in memory cards or the like. Flash memory devices are generally of two types: the NAND-type flash memory device and the NOR-type flash memory device.

A cell array region of the NAND-type flash memory device comprises a plurality of strings. The string typically includes a string selection transistor, a plurality of cell transistors and a ground selection transistor, which are serially connected. The drain region of the string selection transistor is connected to a bit line, and the source region of the ground selection transistor is connected to a common source line.

A cell array region of the NOR-type flash memory device contains a plurality of cell transistors, bit lines and common source lines. Here, only one cell transistor is electrically interposed between the bit line and the common source line.

Accordingly, the NAND-type flash memory device has higher integration density and smaller cell current as compared to the NOR-type flash memory device. The cell current corresponds to current flowing through the bit line and the common source line during a read mode. Thus, it is required to increase the cell current of the NAND-type flash memory device more so than it is in the NOR-type flash memory device. This is because the cell current directly affects access time of the flash memory device. As a result, it is required to decrease electrical resistance of the bit line and/or the common source line in order to improve the access time of the NAND-type flash memory device.

FIG. 1 is a top plan view showing a portion of cell array region of a conventional NAND-type flash memory device. Also, FIG. 2A is a cross-sectional view along the line I—I of FIG. 1, and FIG. 2B is a cross-sectional view along the line II—II of FIG. 1.

Referring to FIGS. 1, 2A and 2B, an isolation layer 1a defining a plurality of active regions 1 is formed at a predetermined region of a semiconductor substrate 10. The active regions 1 are defined in parallel to each other. A string selection line pattern 2s, first to $n^{th}$ word line patterns WP1 to WPn, and a ground selection line pattern 2g are formed across the isolation layer 1a and the active regions 1. Impurity regions 7, 7d and 7s are formed at the active regions 1 among the string selection line pattern 2s, the first to $n^{th}$ word line patterns WP1 to WPn, and the ground selection line pattern 2g. Here, the impurity region 7d formed at one side of the string selection line pattern 2s acts as a drain region of the string selection transistor. Also, the impurity region 7s formed at one side of the ground selection line pattern 2g acts as a source region of the ground selection transistor.

Accordingly, the string selection transistor is formed at a portion at which the string selection line pattern 2s and the active region 1 intersect each other. Similarly, the ground selection transistor is formed at a portion at which the ground selection line pattern 2g and the active region 1 intersect each other. Also, the cell transistors are formed at portions at which the word line patterns WP1 to WPn and the active region 1 intersect each other. As a result, a string is formed at each active region 1. Here, the string includes the string selection transistor, the cell transistors and the ground selection transistor that are serially connected.

A first interlayer insulating layer 4 is formed on the entire surface of the substrate including the strings. The first interlayer insulating layer 4 is patterned to form common source line contact holes 3 exposing the respective source regions 7s. A conductive layer filling the common source line contact holes 3, e.g., a doped polysilicon layer, is then formed on the first interlayer insulating layer 4. The conductive layer is patterned to form a common source line 5 covering the common source line contact holes 3. The common source line 5 is electrically connected to the source regions 7s through the common source line contact holes 3.

The common source line 5 and the first interlayer insulating layer 4 are covered with a second interlayer insulating layer 6. The second interlayer insulating layer 6 and the first interlayer insulating layer 4 are successively patterned to form bit line contact holes 8 exposing the respective drain regions 7d. Bit line contact plugs 8a are formed in the respective bit line contact holes 8. A metal layer is formed on the entire surface of the resultant structure where the bit line contact plugs 8a are formed. The metal layer is then patterned to form a plurality of bit lines 9 covering the respective bit line contact plugs 8a. The plurality of bit lines 9 cross over the first to $n^{th}$ word line patterns WP1 to WPn.

As described above, according to the conventional technology, the common source line is interposed between the first and second interlayer insulating layers. Thus, the thickness of the common source line should be increased in order to reduce the resistance of the common source line. However, in the event that the thickness of the common source line is increased, the thickness of the second interlayer insulating layer should be also increased in order to enhance the isolation characteristic between the bit lines and the common source line. At this time, the aspect ratio of the bit line contact holes penetrating the first and second interlayer insulating layers is increased. As a result, it is required to minimize the resistance of the common source line as well as the aspect ratio of the bit line contact holes.

SUMMARY OF THE INVENTION

It is therefore a feature of the present invention to provide a NAND-type flash memory device having low resistance in a common source line as well as low aspect ratio of the bit line contact holes. It is another feature of the present invention to provide methods of fabricating a NAND-type flash memory device, which can minimize the aspect ratio of the bit line contact holes and the resistance of the common source line.

These and other features of the present invention may be provided by a NAND-type flash memory device according to the invention. The device of the invention includes a plurality of isolation layers formed at predetermined regions of a semiconductor substrate and running parallel with each other. A string selection line pattern and a ground selection line pattern cross over active regions between the plurality of isolation layers. The string selection line pattern and the ground selection line pattern run parallel with each other. A plurality of word line patterns is disposed between the string selection line pattern and the ground selection line pattern. Source regions are formed at the active regions adjacent to the ground selection line patterns. The source regions are located opposite the string selection line pattern. Drain regions are formed at the active regions adjacent to the string selection line patterns, the drain regions being located opposite the ground selection line pattern. A common source line is disposed on the source regions and the isolation layers between the source regions, the common source line running parallel with the ground selection line pattern and being electrically connected to the source regions.

A plurality of bit lines are disposed across the plurality of word line patterns and the common source line. The respective bit lines are electrically connected to the respective drain regions. A drain contact plug may be interposed between the bit line and the drain region. Also, first and second interlayer insulating layers, which are sequentially stacked, are interposed between the bit lines and the word line patterns. Here, the second interlayer insulating layer is interposed between the bit lines and the common source line.

In one embodiment, the common source line is formed of a doped polysilicon layer and/or a refractory metal polycide layer in order to reduce the resistance of the common source line. Also, the top surface of the common source line may be even with or lower than that of the first interlayer insulating layer.

In accordance with another feature of the present invention, there is provided a method of fabricating a NAND-type flash memory device. This method includes forming a first interlayer insulating layer on an entire surface of a substrate having a plurality of strings which are parallel to each other, patterning the first interlayer insulating layer to form a slit-type common source line contact hole exposing source regions of the respective strings and isolation layers between the source regions, and forming a common source line in the slit-type common source line contact hole. Here, drain regions of the respective strings may be exposed by drain contact holes during formation of the common source line contact hole.

The method of forming the plurality of strings includes forming an isolation layer defining a plurality of active regions which run parallel with each other at a predetermined region of a semiconductor substrate, forming a tunnel oxide layer on the active regions, and forming a string selection line pattern, a plurality of word line patterns, and a ground selection line pattern crossing over the active regions covered by the tunnel oxide layer and isolation layer between the active regions. In addition, the method of forming the plurality of strings includes ion implanting impurities into the active regions among the string selection line pattern, the plurality of word line patterns, and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern.

Alternatively, the plurality of strings may be formed using a self-aligned shallow trench isolation technique. Specifically, this method includes the steps of sequentially forming a tunnel oxide layer and a first conductive layer on a semiconductor substrate. The first conductive layer and the tunnel oxide layer are successively patterned to form a first conductive layer pattern exposing a predetermined portion of the semiconductor substrate. The exposed substrate is etched to form a trench region defining a plurality of active regions, which run parallel with each other. The trench region is filled with an isolation layer. The first conductive layer pattern and the isolation layer are covered with a second conductive layer. The second conductive layer is patterned to form a second conductive layer pattern exposing the isolation layer. An inter-gate dielectric layer and a third conductive layer are sequentially formed on the entire surface of the substrate including the second conductive layer pattern. The third conductive layer, the inter-gate dielectric layer, the second conductive layer pattern and the first conductive layer pattern are successively patterned to form a string selection line pattern, a plurality of word line patterns and a ground selection line pattern crossing over the active regions covered with the tunnel oxide layer and the isolation layer between the active regions. Impurities are ion-implanted into the active regions among the string selection line pattern, the plurality of word line patterns and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern.

In one embodiment, an etch stop layer having an etching selectivity with respect to the first interlayer insulating layer is formed prior to formation of the first interlayer insulating layer. At this time, the method of forming the slit-type common source line contact hole and the drain contact holes includes the steps of patterning the first interlayer insulating layer to selectively expose the etch stop layer on the source regions and the isolation layer between the active regions and the etch stop layer on the drain regions. The exposed etch stop layer is etched, thereby exposing the source regions and the isolation layer between the active regions and concurrently exposing the drain regions. Here, the drain contact holes exposing the respective drain regions may not be formed.

In one embodiment, the common source line is formed by depositing a conductive layer, e.g., a doped polysilicon layer, filling the common source line contact hole, on the entire surface of the substrate including the common source line contact hole and planarizing the conductive layer until the first interlayer insulating layer is exposed. Thus, the top surface of the common source line is even with or lower than that of the first interlayer insulating layer. In addition, a refractory metal silicide layer may be formed on the conductive layer pattern in order to reduce the resistance of the common source line. At this time, in the event that the drain contact holes are formed, a plurality of drain contact plugs are formed in the respective drain contact holes.

Moreover, the method according to the present invention may further includes the steps of forming a second interlayer insulating layer on the entire surface of the substrate having the common source line. The second interlayer insulating layer and the first interlayer insulating layer are successively patterned to form a plurality of bit line contact holes exposing the respective drain regions. A plurality of bit lines covering the respective bit line contact holes are then formed. A plurality of bit line contact plugs may be formed in the respective bit line contact holes prior to formation of the bit lines. In the meantime, in the event that the plurality of drain contact plugs are formed in the respective drain contact holes, the plurality of bit line contact holes expose the respective drain contact plugs. At this time, the bit line contact plug may be interposed between the drain contact plug and the bit line.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
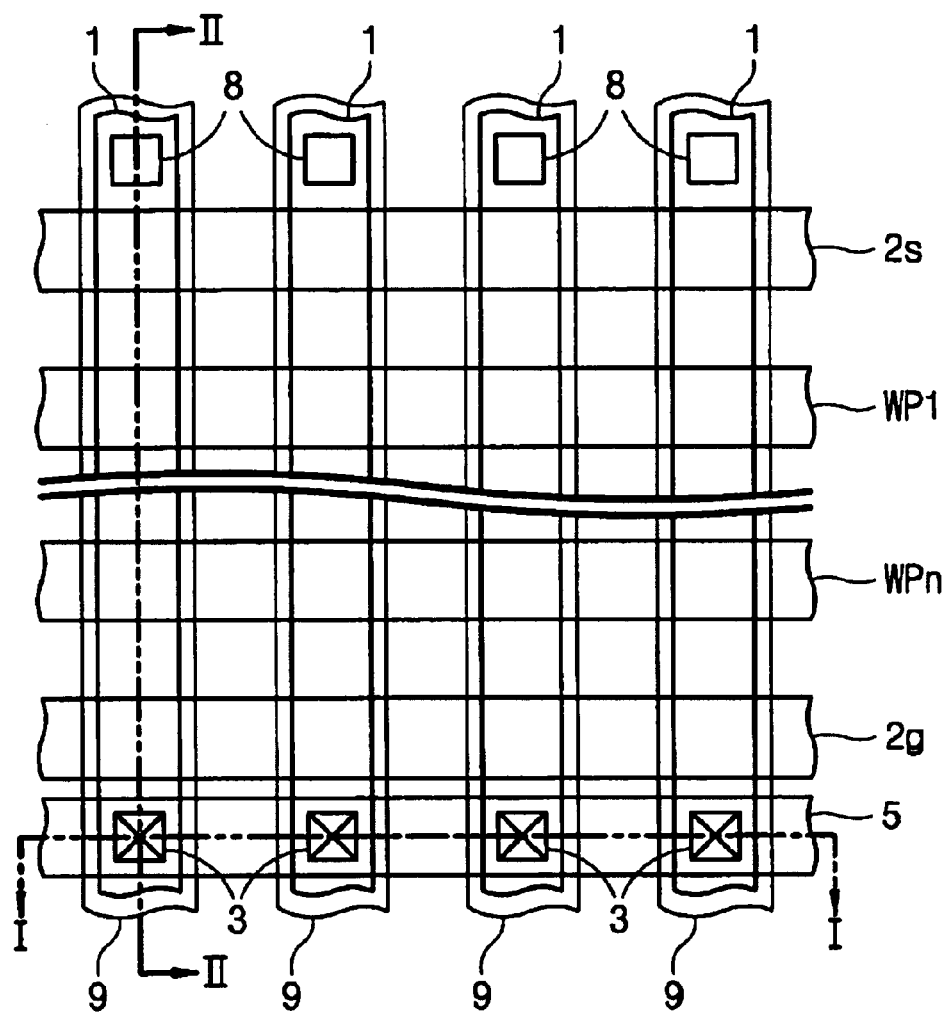
FIG. 1 is a top plan view showing a portion of cell array region of a conventional NAND-type flash memory device.
Figure 2A:
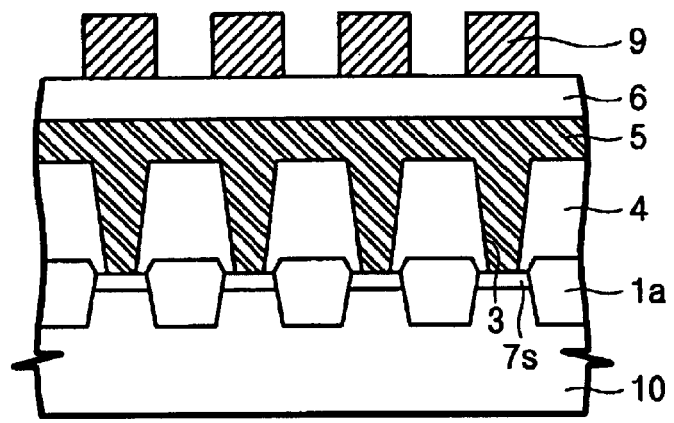
FIG. 2A is a cross-sectional view along the line I—I of FIG. 1.
Figure 2B:
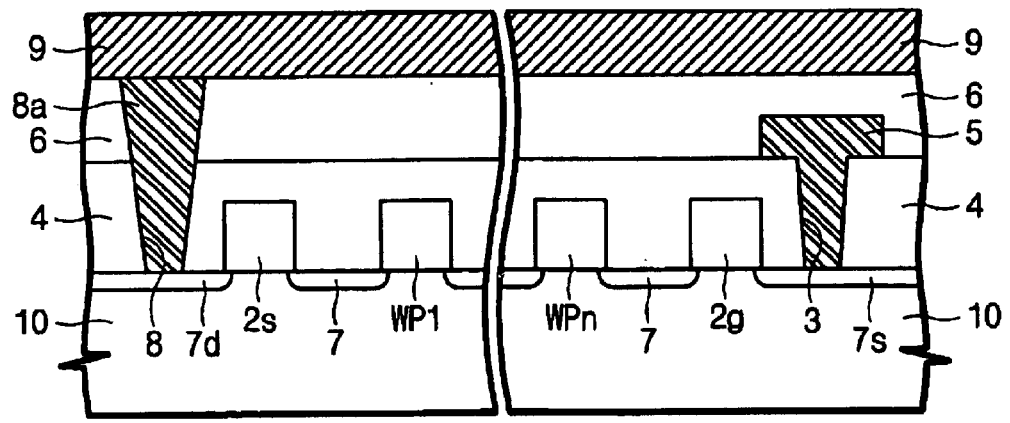
FIG. 2B is a cross-sectional view along the line II—II of FIG. 1.

The present invention will now be described hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention. In the drawings, the thickness of layers and regions are exaggerated for clarity. It will also be understood that when a layer is referred to as being on another layer or substrate, it can be directly on the other layer or substrate, or intervening layers may also be present.

Figure 3A:
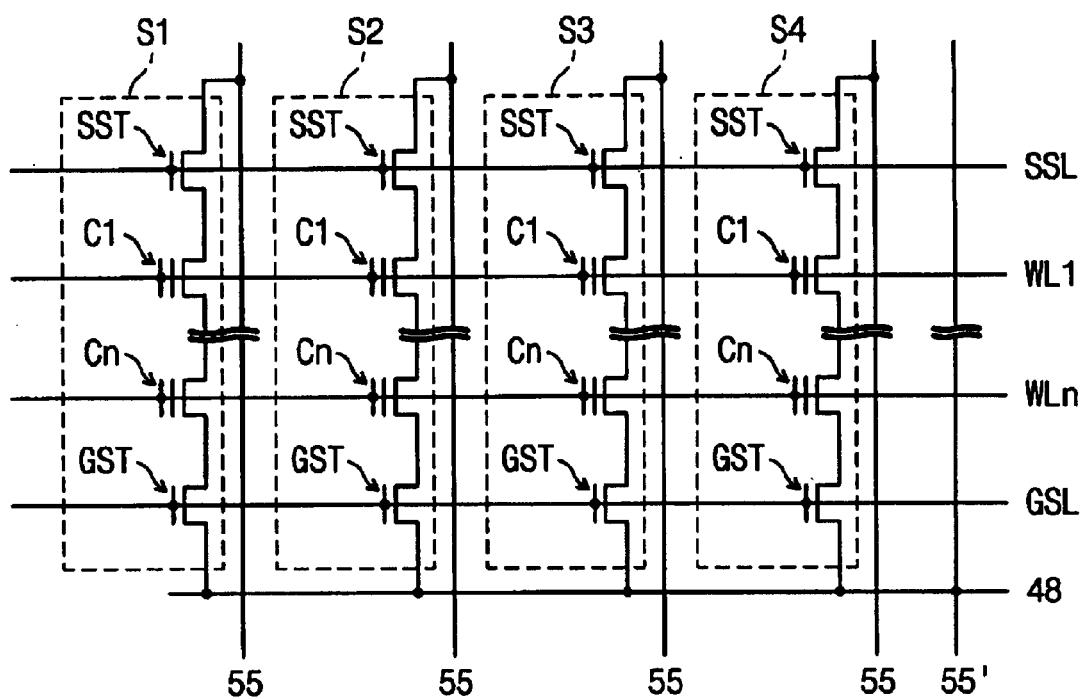
FIG. 3A is an equivalent circuit diagram showing a portion of cell array region of a typical NAND-type flash memory device.

Referring to FIG. 3A, a cell array region of a NAND-type flash memory device includes a plurality of strings, for example, first to fourth strings S1, S2, S3 and S4. Here, each string includes a string selection transistor SST, a plurality of cell transistors C1 to Cn, and a ground selection transistor GST which are serially connected. Each cell transistor has a stacked gate pattern, which includes a floating gate and a control gate electrode. Gate electrodes of the respective string selection transistors SST are electrically connected to a string selection line SSL. Similarly, gate electrodes of the respective ground selection transistors GST are electrically connected to a ground selection line GSL. Also, all the control gate electrodes of the first cell transistors C1 in the plurality of strings are electrically connected to a first word line WL1, and all the control gate electrodes of the $n^{th}$ cell transistors Cn in the plurality of strings are electrically connected to a $n^{th}$ word line WLn. As a result, the string selection line SSL, the plurality of word lines WL1 to WLn, and the ground selection line GSL are disposed in parallel.

Drain regions of the string selection transistors SST are electrically connected to a plurality of bit lines 55 respectively, and source regions of the ground selection transistors GST are electrically connected to a common source line 48. The plurality of bit lines 55 are disposed across the plurality of word lines WL1 to WLn. Also, the common source line 48 runs parallel with the ground selection line GSL. In addition, the common source line 48 is electrically connected to a metal interconnection 55', which runs parallel with the bit lines 55. The metal interconnection 55' acts as an interconnection line for connecting the common source line 48 to a peripheral circuit (not shown).

Figure 3B:
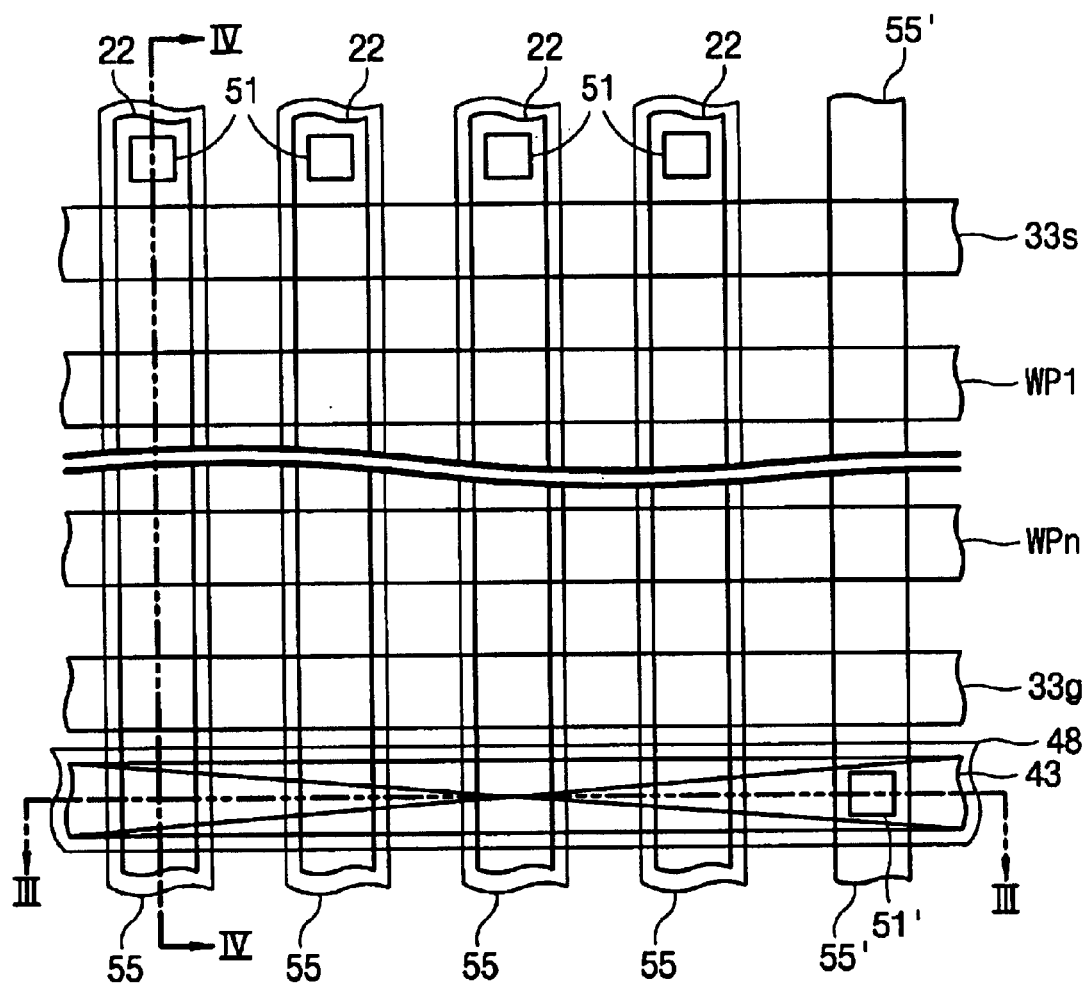
FIG. 3B is a top plan view showing a portion of cell array region of a NAND-type flash memory device according to the present invention.
Figure 4A:
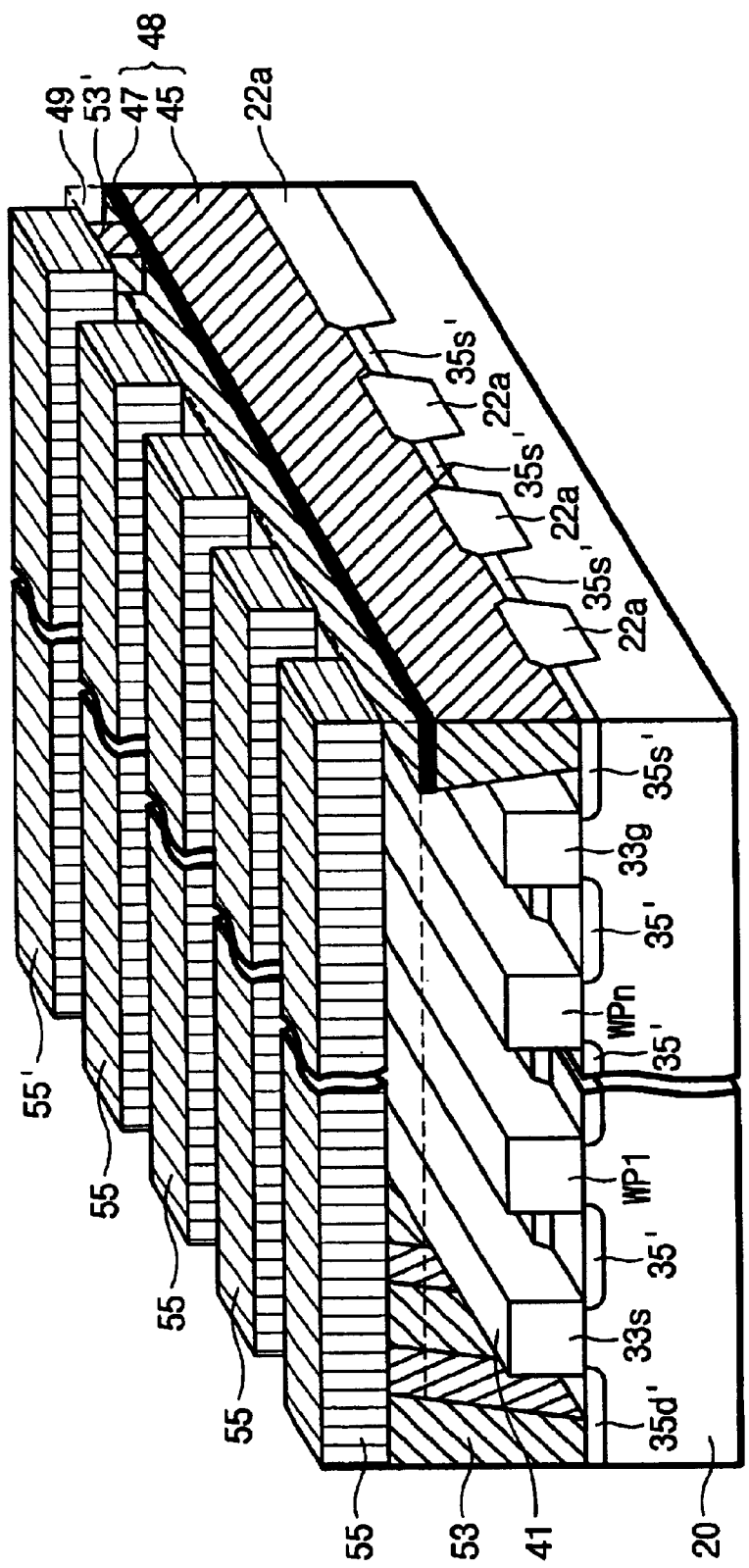
FIG. 4A is a perspective view showing a portion of cell array region of a NAND-type flash memory device according to one embodiment of the present invention.

Referring to FIGS. 3B and 4A, a plurality of active regions 22 are defined in parallel to each other at predetermined regions of a semiconductor substrate 20. The plurality of active regions 22 are defined by forming an isolation layer 22a at a portion of the semiconductor substrate 20. A tunnel oxide layer (not shown) is formed on the active regions 22. A string selection line pattern 33s and a ground selection line pattern 33g cross over the isolation layer 22a and the tunnel oxide layer. Also, a plurality of word line patterns WP1 to WPn are disposed between the string selection line pattern 33s and the ground selection line pattern 33g. Thus, the string selection line pattern 33s, the plurality of word line patterns WP1 to WPn and the ground selection line pattern 33g are disposed in parallel to each other.

The string selection line pattern 33s includes the string selection line (SSL of FIG. 3A), an inter-gate dielectric layer (not shown) and a dummy gate electrode (not shown) which are sequentially stacked. Similarly, the ground selection line pattern 33g includes the ground selection line (GSL of FIG. 3A), an inter-gate dielectric layer (not shown) and a dummy gate electrode (not shown) which are sequentially stacked. Moreover, each word line pattern includes a floating gate (not shown), an inter-gate dielectric layer (not shown) and the word line (WL1, or WLn of FIG. 3A) which are sequentially stacked. Here, the floating gate is located at only the overlapped regions of the active regions 22 and the word line patterns WP1 to WPn.

Impurity regions 35d', 35' and 35s' are formed at the active regions 22 among the string selection line pattern 33s, the word line patterns WP1 to WPn and the ground selection line pattern 33g. The conductivity type of the impurity regions 35d', 35' and 35s' is different from that of the semiconductor substrate 20. The impurity regions 35d', which are adjacent to the string selection line pattern 33s and opposite the ground selection line pattern 33g, act as drain regions of the respective strings, e.g., the respective string transistors. Similarly, the impurity regions 35s', which are adjacent to the ground selection line pattern 33g and opposite the string selection line pattern 33s, act as source regions of the respective strings, e.g., the respective string transistors.

The string selection line pattern 33s and the ground selection line pattern 33g may be formed of only a string selection line SSL and only a ground selection line GSL respectively. At this time, a gate insulating layer, which is thicker than the tunnel oxide layer, may be interposed between the string selection line SSL and the active regions 22. Also, the gate insulating layer may be interposed between the ground selection line GSL and the active regions 22.

The source regions 35s' and the isolation layer 22a between the source regions 35s' are covered with a common source line 48. The common source line 48 preferably comprises a doped polysilicon layer pattern 45 and a metal silicide layer 47 which are sequentially stacked.

A plurality of bit lines 55 and a metal interconnection 55' cross over the plurality of word line patterns WP1 to WPn and the common source line 48. The plurality of bit lines 55 are electrically connected to the plurality of drain regions 35d' respectively. Also, the metal interconnection 55' is electrically connected to a portion of the common source line 48 through a metal contact hole 51'.

A bit line contact plug 53 may be interposed between the bit line 55 and the drain region 35d'. Also, a metal contact plug 53' may be interposed between the metal interconnection 55' and the common source line 48. A first interlayer insulating layer 41 and a second interlayer insulating layer 49 are sequentially stacked between the plurality of word line patterns WP1 to WPn and the plurality of bit lines 55. The second interlayer insulating layer 49 is interposed between the common source line 48 and the plurality of bit lines 55. Here, the top surface of the common source line 48 has the same height as that of the first interlayer insulating layer 41 or may be lower than that of the first interlayer insulating layer 41.

As a result, the common source line 48 is located in a slit-type common source line contact hole 43 penetrating a portion of the first interlayer insulating layer 41. Accordingly, a cross sectional area of the common source line 48 becomes larger as compared to the conventional art. Moreover, since the top surface of the common source line 48 is not higher than that of the first interlayer insulating layer 41, it is possible to minimize the thickness of the second interlayer insulating layer 49. In addition, since the resistance of the common source line is lower than that of the conventional art, it can minimize the number of the metal interconnection 55'. Therefore, it is possible to increase the integration density of the NAND-type flash memory device as compared to the conventional technology.

Figure 4B:
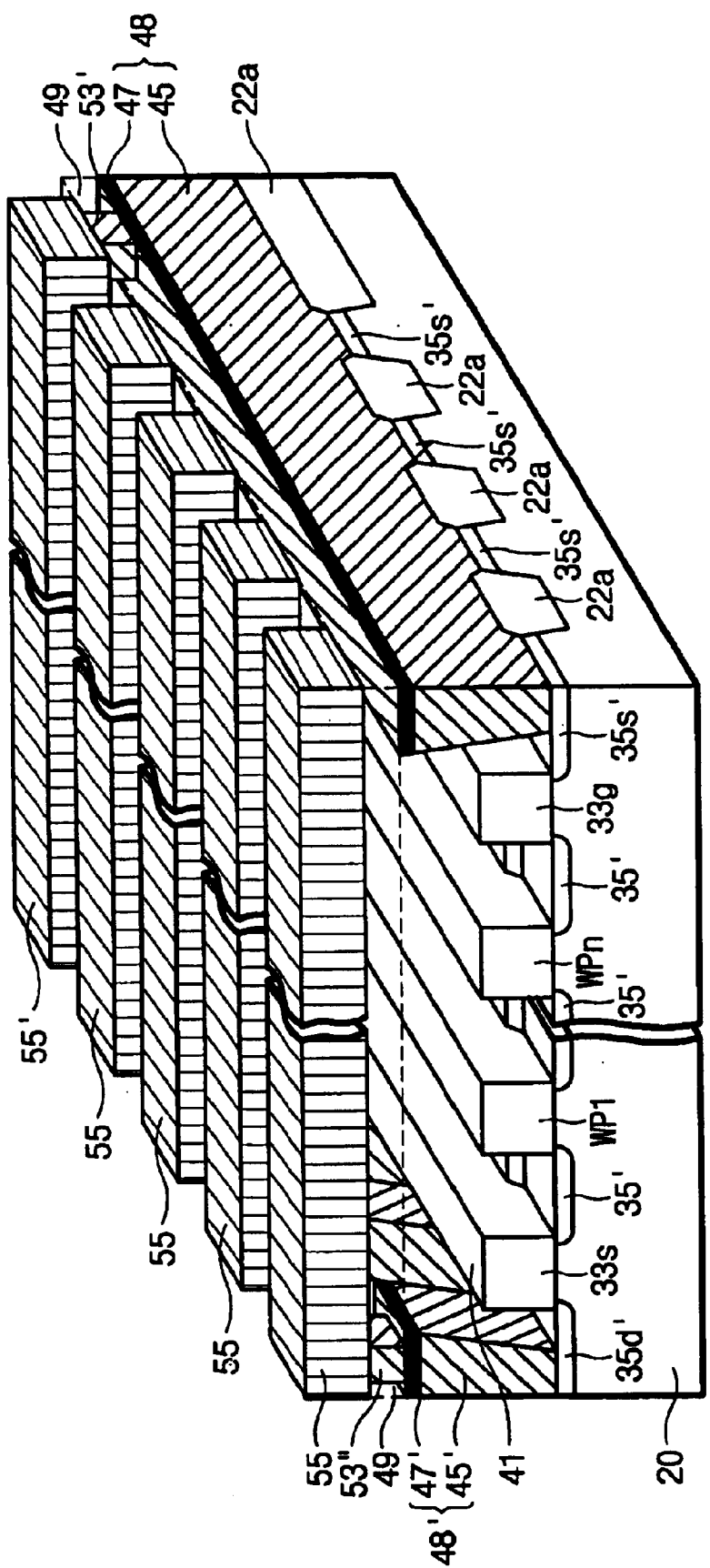
FIG. 4B is a perspective view showing a portion of cell array region of a NAND-type flash memory device according to another embodiment of the present invention.

FIG. 4B is a perspective view showing a structure of the NAND-type flash memory device according to a second embodiment of the present invention. Each bit line 55 of the second embodiment shown in FIG. 4B is electrically connected to the drain region 35d' of each string through a drain contact plug 48' unlike the first embodiment. Specifically, the drain contact plug 48' is formed in a drain contact hole penetrating the first interlayer insulating layer 41. Thus, the top surface of the drain contact plug 48' is not higher than that of the first interlayer insulating layer 41.

Furthermore, the bit line 55 may be electrically connected to the drain contact plug 48' through a bit line contact plug 53' penetrating a portion of the second interlayer insulating layer 49. Alternatively, the bit line 55 may be directly connected to the drain contact plug 48'. Also, the bit line 55 may be directly connected to the drain region 35d'. Here, the drain contact plug 48' preferably comprises a doped polysilicon layer and a metal silicide layer, which are sequentially stacked.

The methods of fabricating a NAND-type flash memory device according to the present invention will be described hereinafter. FIGS. 5A, 6A, 7A and 8A are cross sectional views for illustrating a method of fabricating a NAND-type flash memory device according to one embodiment of the present invention, along the line III—III of FIG. 3B. Also, FIGS. 5B, 6B, 7B and 8B are cross sectional views for illustrating a method of fabricating a NAND-type flash memory device according to one embodiment of the present invention, along the line IV—IV of FIG. 3B.

Figure 5A:
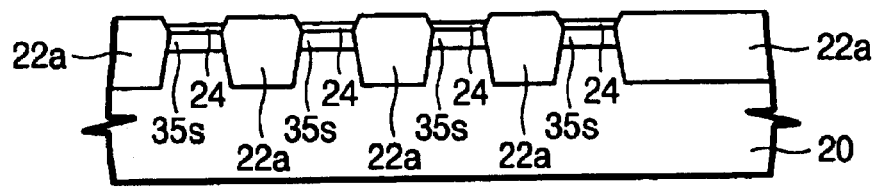
FIGS. 5A, 6A, 7A and 8A are cross-sectional views illustrating a method of fabricating a NAND-type flash memory device according to one embodiment of the present invention, along the line III—III of FIG. 3B.
Figure 5B:
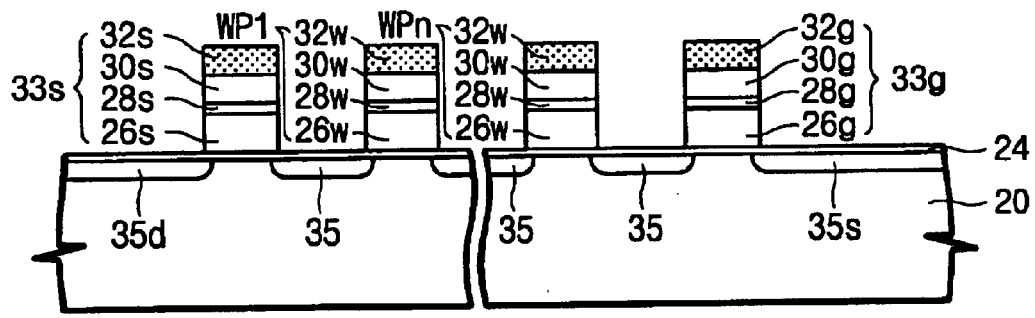
FIGS. 5B, 6B, 7B and 8B are cross-sectional views illustrating a method of fabricating a NAND-type flash memory device according to one embodiment of the present invention, along the line IV—IV of FIG. 3B.

Referring to FIGS. 5A and 5B, an isolation layer 22a is formed at a predetermined region of a semiconductor substrate 20, to thereby defin a plurality of active regions that run parallel with each other. The isolation layer 22a is formed using a conventional isolation technique, for example, a LOCOS (local oxidation of silicon) process or a trench isolation process. A tunnel oxide layer 24 is formed on the active regions. The tunnel oxide layer 24 is preferably formed to a thickness of 100A or less.

A string selection line pattern 33s, a plurality of word line patterns WP1 to WPn and a ground selection line pattern 33g are formed across the active regions and the isolation layer 22a. The string selection line pattern 33s comprises a string selection line 26s (corresponding to SSL of FIG. 3A), an inter-gate dielectric layer 28s, a dummy gate electrode 30s and capping layer pattern 32s which are sequentially stacked, as shown in FIG. 5B. Similarly, the ground selection line pattern 33g comprises a ground selection line 26g (corresponding to GSL of FIG. 3A), an inter-gate dielectric layer 28g, a dummy gate electrode 30g and capping layer pattern 32g which are sequentially stacked, as shown in FIG. 5B.

Also, each word line pattern WP1, . . . , or WPn comprises a floating gate 26w, an inter-gate dielectric layer 28w, a control gate electrode 30w (corresponding to WL1, . . . , or WLn of FIG. 3A) and capping layer pattern 32w which are sequentially stacked, as shown in FIG. 5B. Here, the floating gate 26w is formed at a portion that the word line pattern is overlapped with the active region. The capping layer patterns 32s, 32w and 32g are all formed of an insulating layer such as a silicon nitride layer, silicon oxynitride layer or silicon oxide layer. The capping layer patterns 32s, 32w and 32g may not be formed.

Subsequently, impurities are ion-implanted into the active regions among the string selection line pattern 33s, the plurality of word line patterns WP1 to WPn and the ground selection line pattern 33g, thereby forming low concentration impurity regions 35d, 35 and 35s. In one embodiment, the low concentration impurity regions 35d, 35 and 35s are formed by implanting the impurities at a low dose of $1\times10^{12}$ to $1\times10^{12}$ ion atoms/cm$^2$. At this time, conductivity of the impurities is different from that of the substrate 20. Here, the low concentration impurity regions 35d, which are adjacent to the string selection line pattern 33s and opposite the ground selection line pattern 33g, correspond to low concentration drain regions of the respective strings. Similarly, the low concentration impurity regions 35s, which are adjacent to the ground selection line pattern 33g and opposite the string selection line pattern 33s, correspond to low concentration source regions of the respective strings.

Figure 6A:
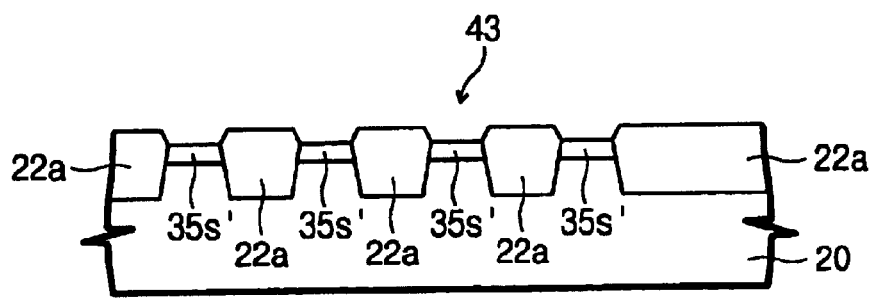
Figure 6B:
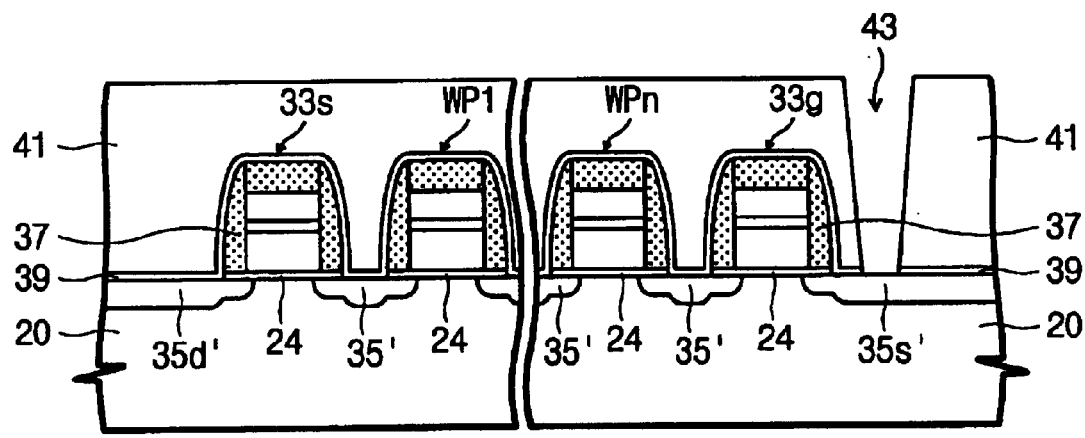

Referring to FIGS. 6A and 6B, spacers 37 are formed on the sidewalls of the string selection line pattern 33s, the plurality of word line patterns WP1 to WPn and the ground selection line pattern 33g. The spacers 37 are formed of a silicon oxide layer or silicon nitride layer. Impurities having the same conductivity type as the low concentration impurity regions are implanted into the low concentration impurity regions using the spacers 37 as ion-implantation masks, thereby forming impurity regions 35d', 35' and 35s'. In one embodiment, the impurities for forming the impurity regions 35d', 35' and 35s' are implanted at a high dose of $5 \times 10^{14}$ to $4 \times 10^{15}$ ion atoms/cm$^2$. Thus, the impurity regions 35d', 35' and 35s' show an LDD (lightly doped drain) structure. The impurity regions 35d' correspond to drain regions of the respective strings, and the impurity regions 35s' correspond to source regions of the respective strings. The ion implantation process for forming the impurity regions 35d', 35' and 35s' may be omitted.

A thin etch stop layer 39 having a thickness of 100A to 500A is formed on the entire surface of the resultant structure where the impurity regions 35d', 35' and 35s' are formed. The etch stop layer 39 is preferably formed of a insulating layer having an etching selectivity with respect to a first interlayer insulating layer formed in a subsequent process. For example, the etch stop layer 39 is preferably formed of silicon nitride layer. The substrate including the etch stop layer 39 is covered with a first interlayer insulating layer 41. The first interlayer insulating layer 41 is preferably formed of a planarized BPSG layer or a planarized USG (undoped silicate glass) layer.

The first interlayer insulating layer 41 is patterned to expose the etch stop layer 39 on the source regions 35s' and the isolation layer 22a between the source regions 35s'. The exposed etch stop layer 39 is then etched to form a slit-type common source line contact hole 43 exposing the source regions 35s' and the isolation layer 22a between the source regions 35s'. Accordingly, even though the first interlayer insulating layer 41 is over-etched, it can prevent the isolation layer 22a from being recessed.

Figure 7A:
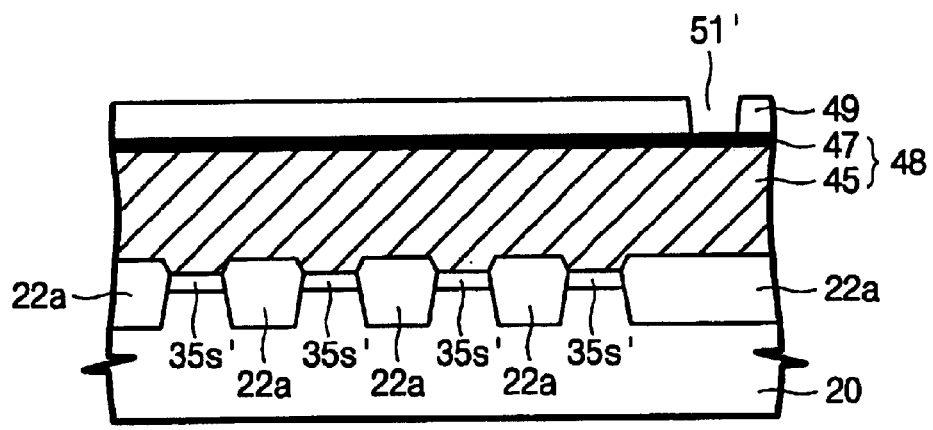
Figure 7B:
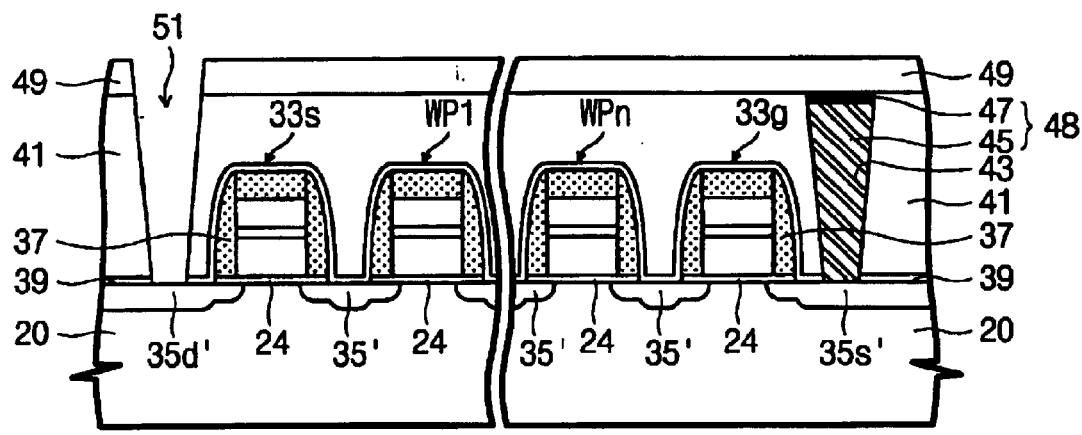

Referring to FIGS. 7A and 7B, the common source line contact hole 43 and the first interlayer insulating layer 41 are covered with a conductive layer filling the common source line contact hole 43. The conductive layer is preferably formed of a doped polysilicon layer showing good step coverage. The conductive layer is etched-back until the top surface of the first interlayer insulating layer 41 is exposed, thereby forming a conductive layer pattern 45, i.e., a polysilicon layer pattern in the common source line contact hole 43. Preferably, a metal silicide layer 47 such as cobalt silicide layer is further formed on the conductive layer pattern 45 using a conventional manner. In this case, it is possible to reduce resistance of the common source line 48 composed of the conductive layer pattern 45 and the metal silicide layer 47. The process for forming the metal silicide layer 47 can be omitted. As a result, the common source line 48, i.e., the conductive layer pattern 45 is formed using a damascene technology. Thus, it can prevent a protrusion due to the common source line 48 from being formed on the first interlayer insulating layer 41.

In the meantime, the common source line 48 may be recessed due to over-etching of the conductive layer. At this time, the upper sidewall of the common source line contact hole 43 may be exposed. The first interlayer insulating layer 41 and the common source line 48 are covered with a second interlayer insulating layer 49 such as a planarized silicon oxide layer. The second interlayer insulating layer 49, the first interlayer insulating layer 41 and the etch stop layer 39 are sequentially patterned to form bit line contact holes 51 exposing the respective drain regions 35d' and a metal contact hole 51' exposing a portion of the common source line 48. At this time, though not shown in the figure, metal contact holes in a peripheral circuit region are also formed.

Figure 8A:
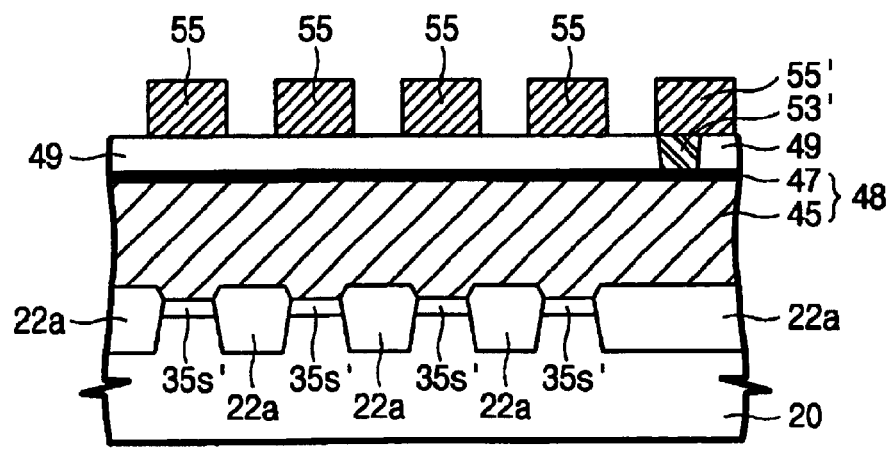
Figure 8B:
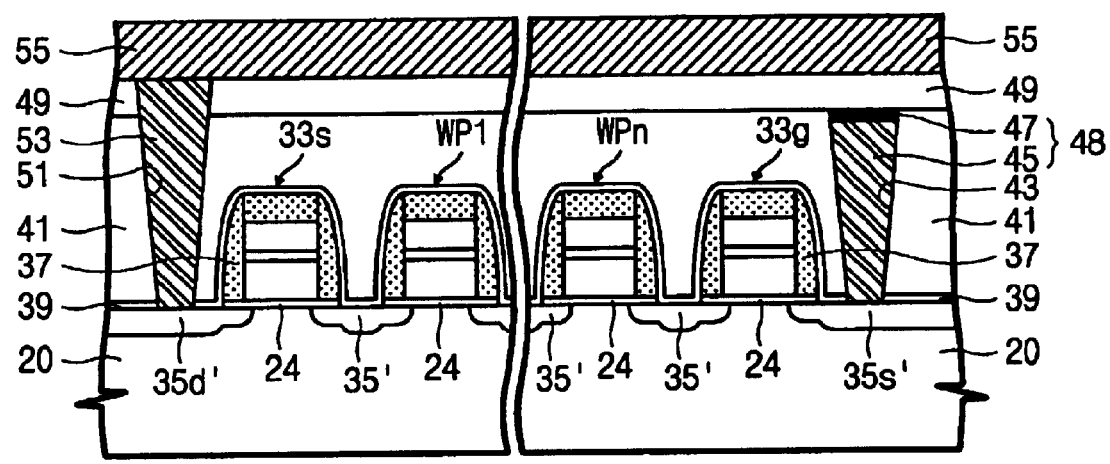

Referring to FIGS. 8A and 8B, a conductive layer such as a doped polysilicon layer, filling the bit line contact holes 51 and the metal contact hole 51', is formed on the second interlayer insulating layer 49. The conductive layer is etched-back until the top surface of the second interlayer insulating layer 49 is exposed, to thereby form bit line contact plugs 53 and a metal contact plug 53' in the respective bit line contact holes 51 and in the metal contact hole 51' respectively. A metal layer such as an aluminum layer is formed on the entire surface of the resultant having the bit line contact plugs 53 and the metal contact plug 53'. The metal layer is patterned to form bit lines 55 being in contact with the respective bit line contact plugs 53 and a metal interconnection 55' being in contact with the metal contact plug 53'. The bit lines 55 and the metal interconnection 55' cross over the plurality of word line patterns WP1 to WPn and the common source line 48.

In the meantime, the process for forming the bit line contact plugs 53 and the metal contact plug 53' may be omitted. At this time, the bit lines 55 and the metal interconnection 55' are in directly contact with the drain regions 35d' and the common source line 48, respectively.

Figure 9A:
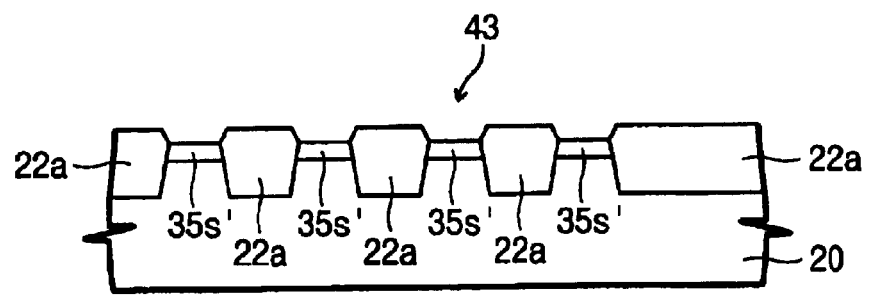
FIGS. 9A, 10A and 11A are cross-sectional views illustrating a method of fabricating a NAND-type flash memory device according to another embodiment of the present invention, along the line III—III of FIG. 3B.
Figure 9B:
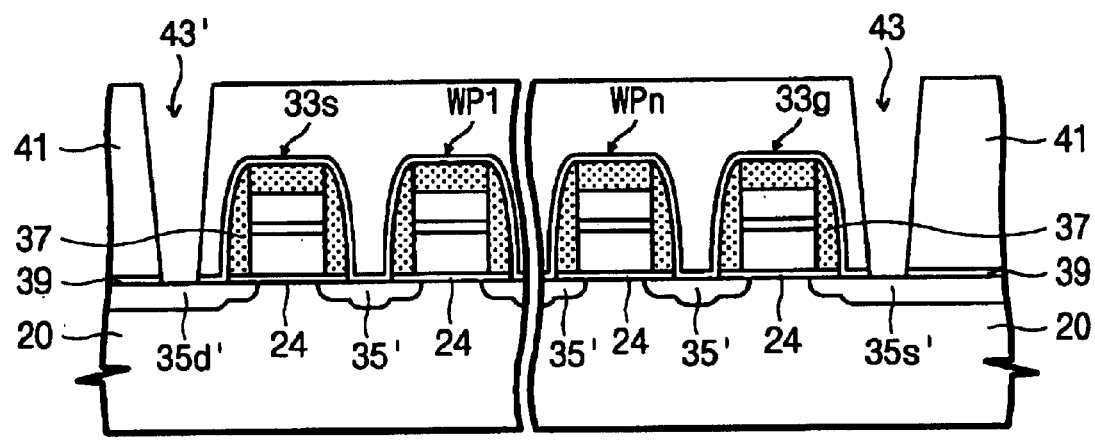
FIGS. 9B, 10B and 11B are cross-sectional views illustrating a method of fabricating a NAND-type flash memory device according to another embodiment of the present invention, along the line IV—IV of FIG. 3B.
Figure 10A:
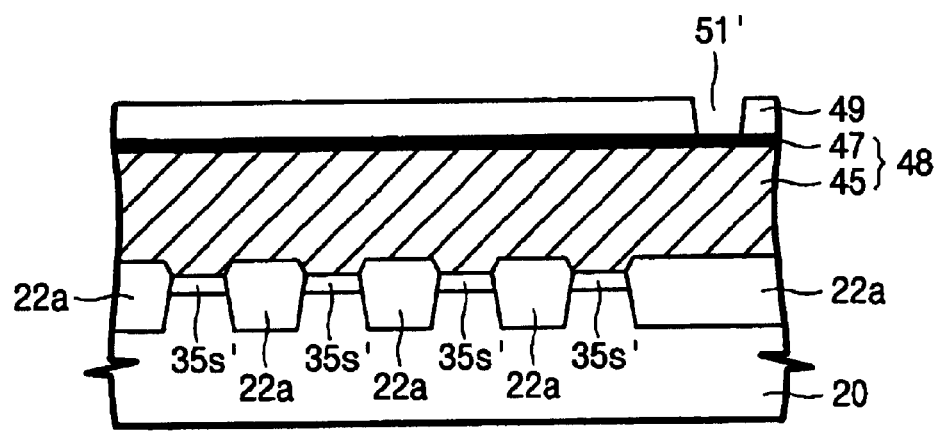
Figure 10B:
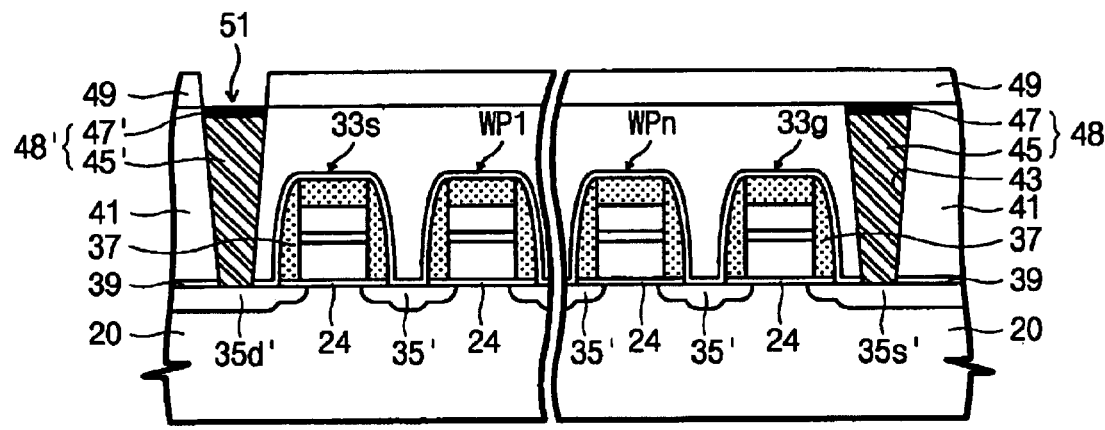
Figure 11A:
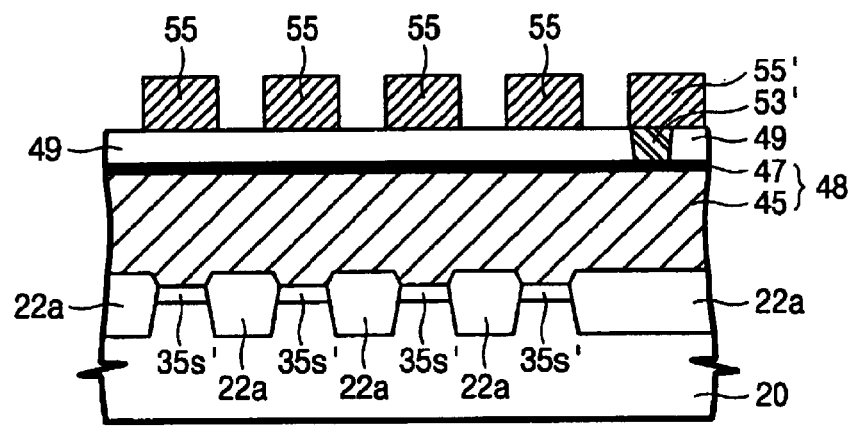
Figure 11B:
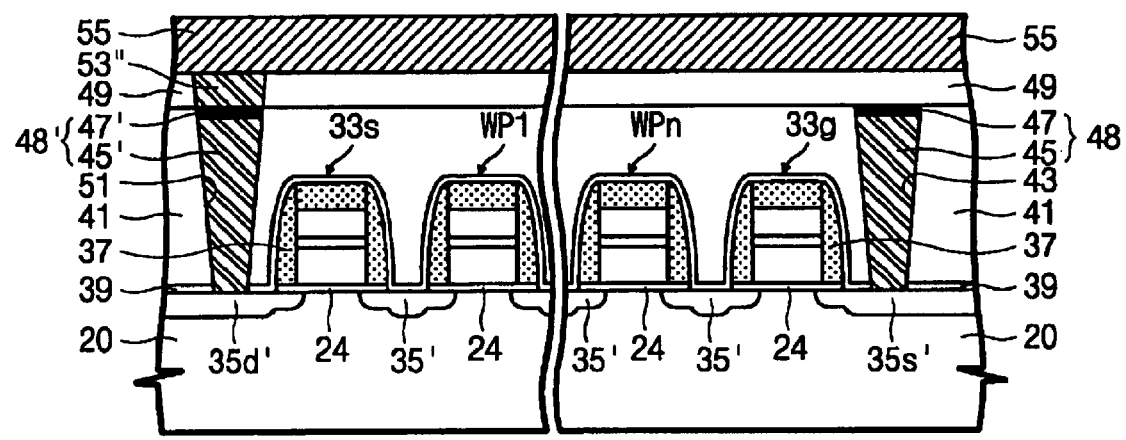

FIGS. 9A, 10A and 11A are cross sectional views for illustrating a method of fabricating a NAND-type flash memory device according to a second embodiment of the present invention, along the line III—III of FIG. 3B. Also, FIGS. 9B, 10B and 11B are cross sectional views for illustrating a method of fabricating a NAND-type flash memory device according to a second embodiment of the present invention, along the line IV—IV of FIG. 3B. Here, the same parts as the first embodiment are indicated with the same reference numbers, and so their explanation will be described briefly or omitted.

Referring to FIGS. 9A and 9B, an isolation layer 22a, a tunnel oxide layer 24, a string selection line pattern 33s, a plurality of word line patterns WP1 to WPn, a ground selection line pattern 33g, impurity regions 35d', 35' and 35s' and spacers 37 are formed using the same manners as in the first embodiment. An etch stop layer 39 and a first interlayer insulating layer 41 are sequentially formed on the entire surface of the substrate including the spacers 37 and the impurity regions 35d', 35' and 35s'. The first interlayer insulating layer 41 and the etch stop layer 39 are successively patterned to form a slit-type common source line contact hole 43 having the same shape as in the first embodiment and to concurrently form drain contact holes 43' exposing the respective drain regions 35d'.

Referring to FIGS. 10A and 10B, a conductive layer, filling the drain contact holes 43' and the common source line contact hole 43, is formed on the first interlayer insulating layer 41. The conductive layer is preferably formed of a doped polysilicon layer like the first embodiment. The conductive layer is planarized until the top surface of the first interlayer insulating layer 41 is exposed, thereby forming a first conductive layer pattern 45 in the common source line contact hole 43 and second conductive layer patterns 45' in the respective drain contact holes 43'.

Preferably, a first and second metal silicide layers 47 and 47' are selectively formed on the first conductive layer pattern 45 and the second conductive layer patterns 45', respectively. In this case, the first conductive layer pattern 45 and the first metal silicide layer 47 constitute a common source line 48, and the second conductive layer pattern 45' and the second metal silicide layer 47' formed thereon constitute a drain contact plug 48'. Thus, it is possible to reduce resistance of the common source line 48 as well as the drain contact plug 48'. The process for forming the first and second metal silicide layers 47 and 47' can be omitted.

Subsequently, a second interlayer insulating layer 49 is formed on the entire surface of the substrate including the common source line 48 and the drain contact plugs 48'. The second interlayer insulating layer 49 is patterned to form bit line contact holes 51 exposing the respective drain contact plugs 48' and a metal contact hole 51' exposing a portion of the common source line 48. At this time, though not shown in the figure, metal contact holes in a peripheral circuit region are also formed.

Referring to FIGS. 11A and 11B, a plurality of bit lines 55 and a metal interconnection 55' are formed on the second interlayer insulating layer 49 using the same manner as in the first embodiment. Thus, the respective bit lines 55 are connected to the respective drain contact plugs 48' through bit line contact plugs 53" or may be directly connected to the respective drain contact plugs 48'. Similarly, the metal interconnection 55' are connected to the common source line 48 through a metal contact plug 53' or may be directly connected to the common source line 48.

As described above, according to various embodiment of the present invention, a common source line is formed in the slit-type common source line contact hole using the damascene process. Therefore, it can maximize the cross sectional area of the common source line and minimize the thickness of the second insulating layer. As a result, it is possible to improve the aspect ratio of the bit line contact hole and the operation speed of the NAND-type flash memory device using the simple process.

In addition, according to the present invention, it can minimize the number of metal interconnection used in the cell array region. Therefore, it is possible to increase the integration density of the NAND-type flash memory device.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of fabricating a NAND-type flash memory device, comprising:

forming a plurality of isolation layers running parallel with each other at predetermined regions of a semiconductor substrate;

forming a string selection line pattern and a ground selection line pattern crossing over active regions between the plurality of isolation layers, the string selection line pattern and the ground selection line pattern running parallel with each other;

forming a plurality of word line patterns disposed between the string selection line pattern and the ground selection line pattern;

ion-implanting impurities into the active regions among the string selection line pattern, the plurality of word line patterns and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern;

forming a first interlayer insulating layer on the entire surface on the substrate including the drain and source regions;

patterning the first interlayer insulating layer to form a slit-type common source line contact hole exposing the source regions and the isolation layers between the source regions; and forming a common source line filling the common source line contact hole such that the common source line is disposed on the source regions and the isolation layers between the source regions, the common source line running parallel with the ground selection line pattern and being electrically connected to the source regions.

2. The method of claim 1, wherein forming the first interlayer insulating layer is preceded by the step of forming an etch stop layer having an etch selectivity with respect to the first interlayer insulating layer on the entire surface of the substrate including the source and drain regions.

3. The method of claim 2, wherein forming the common source line contact hole comprises:

patterning the first interlayer insulating layer to expose the etch stop layer on the source regions and the isolation layers between the source regions; and etching the exposed etch stop layer to expose the source regions and the isolation layers between the source regions.

4. The method of claim 1, wherein forming the common source line comprises the steps of:

forming a conductive layer filling the common source line contact hole on the entire surface of the substrate including the common source line contact hole; and planarizing the conductive layer until the first interlayer insulating layer is exposed.

5. The method of claim 1, wherein forming the common source line comprises:

forming a doped polysilicon layer filling the common source line contact hole on the entire surface of the substrate including the common source line contact hole;

planarizing the doped polysilicon layer until the first interlayer insulating layer is exposed, thereby forming a common source line contact plug in the common source line contact hole; and selectively forming a metal suicide layer on the surface of the common source line contact plug.

6. The method of claim 1, wherein forming the common source line is followed by the steps of:

forming a second interlayer insulating layer on the entire surface of the substrate including the common source line;

sequentially patterning the second interlayer insulating layer and the first interlayer insulating layer to form bit line contact holes exposing the respective drain regions;

forming bit line contact plugs in the respective bit line contact holes;

forming a metal layer on the entire surface of the substrate including the bit line contact plugs; and patterning the metal layer to form a plurality of bit lines electrically connected to the respective bit line contact plugs, the plurality of bit lines crossing over the plurality of word line patterns and the common source line.

7. A method of fabricating a NAND-type flash memory device, comprising:

forming a plurality of isolation layers running parallel with each other at predetermined regions of a semiconductor substrate;

forming a string selection line pattern and a ground selection line pattern crossing over active regions between the plurality of isolation layers, the string selection line pattern and the ground selection line pattern running parallel with each other;

forming a plurality of word line patterns disposed between the string selection line pattern and the ground selection line pattern;

ion-implanting impurities into the active regions among the string selection line pattern, the plurality of word line patterns and the ground selection line pattern, thereby forming drain regions at the active regions adjacent to the string selection line pattern and opposite the ground selection line pattern and concurrently forming source regions at the active regions adjacent to the ground selection line pattern and opposite the string selection line pattern;

forming a first interlayer insulating layer on the entire surface of the substrate including the drain and source regions;

patterning the first interlayer insulating layer, thereby forming a slit-type common source line contact hole exposing the source regions and the isolation layers between the source regions and concurrently forming a plurality of drain contact holes exposing the respective drain regions; and forming a common source line filling the common source line contact hole and a plurality of drain contact plugs filling the respective drain contact holes, such that the common source line is disposed on the source regions and the isolation layers between the source regions, the common source line running parallel with the ground selection line pattern and being electrically connected to the source regions, wherein a top surface level of the common source line is even with or lower than a top surface level of the first interlayer insulating layer.

8. The method of claim 7, wherein forming the first interlayer insulating layer is preceded by the step of forming an etch stop layer having an etch selectivity with respect to the first interlayer insulating layer on the entire surface of the substrate including the source and drain regions.

9. The method of claim 8, wherein forming the common source line contact hole and the plurality of drain contact holes comprises:

patterning the first interlayer insulating layer to expose the etch stop layer on the drain regions, the source regions and the isolation layers between the source regions; and etching the exposed etch stop layer to expose the drain regions, the source regions and the isolation layers between the source regions.

10. The method of claim 7, wherein forming the common source line and the drain contact plugs comprises:

forming a conductive layer filling the common source line contact hole and the drain contact holes on the entire surface of the substrate including the common source line contact hole and the drain contact holes; and planarizing the conductive layer until the first interlayer insulating layer is exposed.

11. The method of claim 7, wherein forming the common source line and the drain contact plugs comprises:

forming a doped polysilicon layer filling the common source line contact hole and the drain contact holes on the entire surface of the substrate including the common source line contact hole and the drain contact holes;

planarizing the doped polysilicon layer until the first interlayer insulating layer is exposed, thereby forming a first polysilicon pattern and second polysilicon patterns in the common source line contact hole and the respective drain contact holes, respectively; and selectively forming a metal silicide layer on the first and second polysilicon patterns.

12. The method of claim 7, wherein forming the common source line and the drain contact plugs is followed by:

forming a second interlayer insulating layer on the entire surface of the substrate including the common source line and the drain contact plugs;

patterning the second interlayer insulating layer to form bit line contact holes exposing the respective drain contact plugs and a metal contact hole exposing a portion of the common source line;

forming a metal layer on the entire surface of the substrate including the bit line contact holes and the metal contact hole; and patterning the metal layer to form a plurality of bit lines electrically connected to the respective drain contact plugs and a metal interconnection electrically connected to the common source line, the plurality of bit lines and the metal line crossing over the plurality of word line patterns and the common source line.

* * * * *